(12) United States Patent
Hong

(10) Patent No.: US 8,828,868 B2
(45) Date of Patent: Sep. 9, 2014

(54) METHOD FOR FORMING HARD MASK IN SEMICONDUCTOR DEVICE FABRICATION

(75) Inventor: Zhongshan Hong, Beijing (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 274 days.

(21) Appl. No.: 13/314,000

(22) Filed: Dec. 7, 2011

(65) Prior Publication Data

US 2012/0295441 A1 Nov. 22, 2012

(30) Foreign Application Priority Data

May 20, 2011 (CN) .......................... 2011 1 0131583

(51) Int. Cl.
*H01L 21/033* (2006.01)
*H01L 21/3213* (2006.01)

(52) U.S. Cl.
CPC ...... *H01L 21/0337* (2013.01); *H01L 21/32139* (2013.01); *H01L 21/0338* (2013.01)
USPC ............ 438/683; 257/E21.158; 257/E21.231; 438/682; 438/703

(58) Field of Classification Search
USPC ....................................................... 438/942
See application file for complete search history.

(56) References Cited

U.S. PATENT DOCUMENTS 6,124,167 A * 9/2000 Kao et al. ...................... 438/257
6,379,869 B1 * 4/2002 Schroeder et al. ............ 430/313

2006/0211260 A1 * 9/2006 Tran et al. ..................... 438/763
2009/0121274 A1 5/2009 Ko
2011/0021010 A1 1/2011 Cheng et al.

FOREIGN PATENT DOCUMENTS

| CN | 1268678 | 10/2000 |
| CN | 101164147 | 4/2008 |
| CN | 11312160 | 11/2008 |
| WO | 2006101695 | 9/2006 |

OTHER PUBLICATIONS

Yamaguchi (Ar Ion Implantation into Resist for Etching Resistance Improvement, Advances in Resist Technology and Processing XVIII, Proceedings of SPIE vol. 4345 (2001)).*
Office Action from corresponding Chinese Patent Appl. No. 201110131583.8, dated Jun. 6, 2014.

* cited by examiner

*Primary Examiner* — Charles Garber
*Assistant Examiner* — Alia Sabur
(74) *Attorney, Agent, or Firm* — Koppel, Patrick, Heybl & Philpott; Michael J. Ram

(57) ABSTRACT

A method for forming a hard mask in semiconductor device fabrication comprises: forming first and second patterned material layers on a third material layer, the second patterned material layer only covering the top of predetermined regions of the first patterned material layer; changing a property of exposed top and side portions of the first patterned material layer using the second patterned material layer as a mask, forming property-changed roofs at the exposed top portions of the first patterned material layer and forming property-changed sidewalls with a predetermined width at the exposed side portions of the first patterned material layer; removing the second patterned material layer and portions of the first patterned material layer with exposed tops and an unchanged property located between the property-changed sidewalls, to form the hard mask.

18 Claims, 7 Drawing Sheets

METHOD FOR FORMING HARD MASK IN SEMICONDUCTOR DEVICE FABRICATION

CROSS-REFERENCE TO RELATED APPLICATIONS

This application claims priority to Chinese Patent Application No. 201110131583.8, filed on May 20, 2011 and entitled "METHOD FOR FORMING HARD MASK IN SEMICONDUCTOR DEVICE FABRICATION", which is incorporated in its entirety by reference herein.

BACKGROUND OF THE INVENTION

1. Field of the Invention

The present invention relates to the field of semiconductor fabrication, and more particularly, to a method for forming a hard mask in semiconductor device fabrication and a method for fabricating a semiconductor device.

2. Description of the Related Art

With the development of integrated circuit techniques, the size of semiconductor devices is significantly reduced. In order to achieve smaller critical dimension (CD), requirement on lithographic resolution are continuously increased. However, due to limitations of lithography processes, it is difficult for patterns formed by direct lithography to meet the requirement for continuously decreased critical dimension. In order to address the limit of lithographic resolution, a double patterning technology (DPT) has been developed and utilized by designers, in which part of features of the desired pattern are transferred to a hard mask layer in each of two lithography steps, so as to obtain a hard mask pattern with a smaller linewidth. Etching is then carried out with the hard mask, allowing smaller critical dimensions to be achieved.

Generally, the double patterning technology may result in the linewidths on a single chip which are the same as the critical dimension. Some applications, however, require different linewidths on a single chip. For example, in NAND flash memory, peripheral and core portions of a single chip have different linewidths. A technique of achieving a hard mask with a smaller linewidth and thus doubling pattern density by doping sidewalls of a patterned silicon layer is disclosed in the U.S. patent publication No. 2011/0021010A1, filed on Jul. 27, 2009, entitled "METHOD FOR DOUBLE PATTERN DENSITY". In this application, a method capable of achieving a hard mask pattern with different linewidths is proposed, which is schematically shown in FIG. 1. As shown in FIG. 1, a cap layer 122 is used as a mask to dope sidewalls of a silicon layer. As a result, doped portions 130 and 131 are obtained, which are then used as a hard mask to pattern the underlying material layer to be etched. In FIG. 1, the doped portions 131 in the right part of the silicon layer have a width of $CD_{min}$, which is a predetermined minimum linewidth. An undoped portion 132 is located between the two doped regions 131. On the other hand, the width W of the left part of the silicon layer is less than two times the $CD_{min}$ ($2*CD_{min}$), so the doped side portions thereof adjoin each other to produce a single doped portion 130 having a width of W. Therefore, doped portions with different widths, such as portions 130 and 131 in FIG. 1, can be obtained by this method. After removing the cap layer 122 and the undoped portion 132, a hard mask pattern composed of doped portions can be obtained. However, such a method has some limitations; the maximum linewidth it can provide is only twice the minimum linewidth, namely, $CD_{min} \leq W \leq 2*CD_{min}$.

Thus, the scheme shown in FIG. 1 can not provide more varied linewidths for chips having such a need. Therefore, it is desirable to provide a new technique to address the above problem.

SUMMARY

An object of embodiments of the present invention is to provide methods for forming a hard mask which can produce more varied linewidths.

According to a first aspect of the present invention, a method for forming a hard mask in semiconductor device fabrication is provided, comprising: forming first and second patterned material layers on a third material layer, the second patterned material layer only covering the top of predetermined regions of the first patterned material layer; changing a property of the exposed top and side portions of the first patterned material layer using the second patterned material layer as a mask, so as to form property-changed roofs at the exposed top portions of the first patterned material layer and form property-changed sidewalls with a predetermined width at the exposed side portions of the first patterned material layer; removing the second patterned material layer; and removing portions of the first patterned material layer which have exposed tops and an unchanged property and are located between the property-changed sidewalls, so as to form the hard mask.

Optionally, patterns in the first and second patterned material layers are linear patterns.

Optionally, at least some pattern features in the predetermined regions of the first patterned material layer have linewidths larger than twice the predetermined width.

Optionally, the step of forming the first and second patterned material layers uses a double patterning procedure comprising: depositing the first material layer on the third material layer; depositing the second material layer on the first material layer; lithographing and etching the second material layer to produce the second patterned material layer, such that the second patterned material layer only covers the top of the predetermined regions of the first material layer; and lithographing and etching the first material layer to produce the first patterned material layer, wherein the predetermined width is less than a minimum width of lines that can be obtained in a single lithographing step.

Optionally, the step of forming the first and second patterned material layers comprises: depositing the first material layer on the third material layer; depositing the second material layer on the first material layer; producing identical patterns through lithographing and etching on the first and second material layers; and removing the second patterned material layer from regions other than the predetermined regions of the first patterned material layer, wherein the predetermined width of the side walls is less than the minimum width of lines that can be obtained in a single lithographing step.

Optionally, the first material is silicon or metal.

Optionally, the second material is silicon nitride, silicon oxide or silicon nitride oxide.

Optionally, changing the property of the exposed top and side portions of the first patterned material layer comprises: doping the exposed top and side portions of the first patterned material layer.

Optionally, the doping is carried out by implantation.

Optionally, the first material is silicon, and wherein changing the property of the exposed top and side portions of the first patterned material layer comprises: applying a salicide process thereto.

Optionally, the salicide process comprises: depositing a metal layer, annealing and then removing portions of the metal layer un-reacted by the salicide process.

Optionally, the metal is nickel, cobalt or titanium.

Optionally, changing the property of the exposed top and side portions of the first patterned material layer comprises: treatment in a reacting gas atmosphere.

Optionally, the reacting gas is an oxygen-contained gas or a $NH_3$-contained gas.

Optionally, the treatment is a thermal treatment.

Optionally, the treatment is a plasma treatment.

According to another aspect of the invention, a method for fabricating a semiconductor device is provided, comprising: forming first and second patterned material layers on a third material layer, the second patterned material layer only covering the top of predetermined regions of the first patterned material layer; changing a property of exposed top and side portions of the first patterned material layer using the second patterned material layer as a mask, so as to form property-changed roofs at the exposed top portions of the first patterned material layer and form property-changed sidewalls with a predetermined width at the exposed side portions of the first patterned material layer; removing the second patterned material layer; removing portions of the first patterned material layer which have exposed tops and an unchanged property and are located between the property-changed sidewalls, so as to form a hard mask; patterning the third material layer using the hard mask; and removing the hard mask.

Optionally, the material in the third material layer is polysilicon, the first material is silicon or metal, and the second material is silicon nitride, silicon oxide or silicon nitride oxide.

Optionally, the step of forming the first and second patterned material layers comprises: depositing the first material layer on the third material layer; depositing the second material layer on the first material layer; producing identical patterns through lithographing and etching on the first and second material layers; and removing the second patterned material layer from regions other than the predetermined regions of the first patterned material layer, wherein the predetermined width of the side walls is less than the minimum width of lines that can be obtained in a single lithographing step.

Optionally, the property of the exposed top and side portions of the first patterned material layer is changed by at least one of: doping the exposed top and side portions of the first patterned material layer; a salicide process; or a treatment in a reacting gas atmosphere.

An advantage of an embodiment of the present invention is that, a hard mask with pattern features of arbitrary widths that are equal to or larger than a minimum linewidth can be achieved on the same chip, so that a requirement for different pattern densities can be satisfied.

BRIEF DESCRIPTION OF THE DRAWINGS

Further features of embodiments of the invention and advantages thereof will become apparent from the following detailed description of exemplary embodiments according to the present invention with reference to the attached drawings, in which.

DESCRIPTION OF THE EMBODIMENTS

Figure 1:
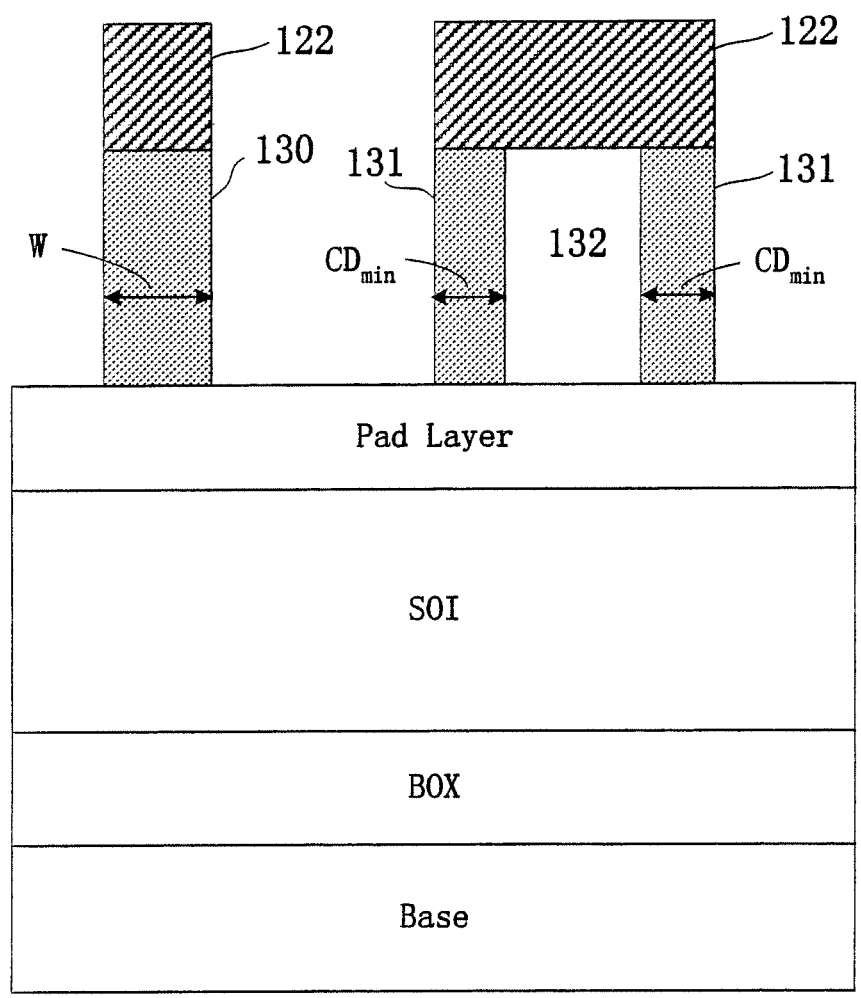
FIG. 1 is a diagram showing a prior art method for forming a hard mask.

One or more specific embodiments of the present invention will be described below. It should be noted that not all of features in practical implementations are described in this specification for providing a concise description of those embodiments. Also, the description of the following exemplary embodiments is merely illustrative and is not intended to be limiting of the present invention and its applications. Not all of steps or components involved in embodiments and drawings are essential technical features of the present invention, and can be modified, deleted and/or substituted as required. Also, it should be noted that similar reference numerals and letters refer to similar items in the following figures, and thus once an item is defined in one figure, it is possible that it need not be further discussed for following figures.

FIGS. 2A-2F are sectional views of structures in the respective steps of a method for forming a hard mask according to an embodiment of the present invention.

Figure 2A:
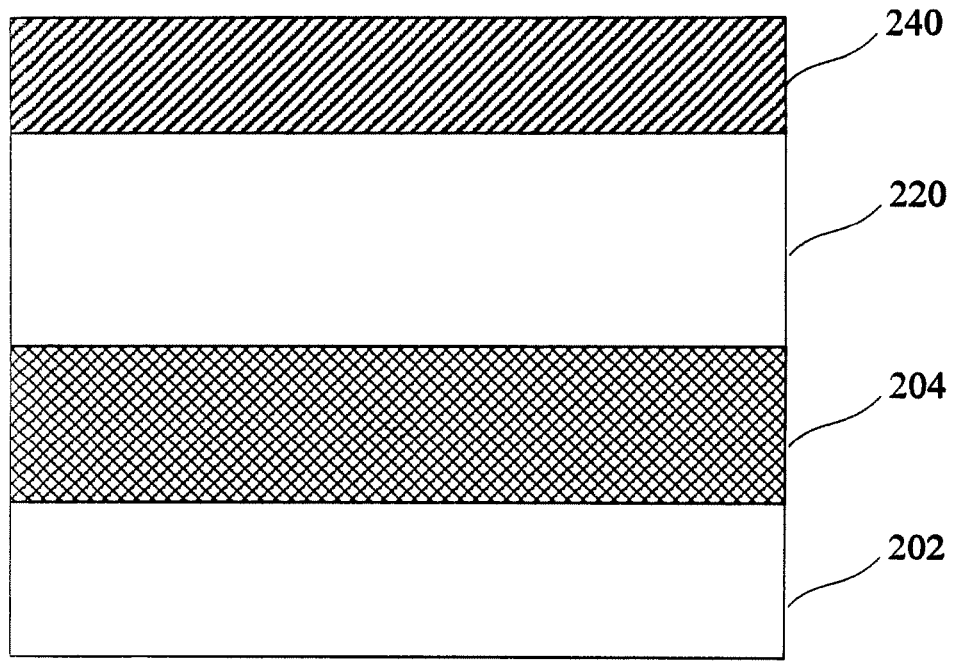
FIGS. 2A-2F are sectional views of structures in the respective steps of a method for forming a hard mask according to an embodiment of the present invention.

As shown in FIG. 2A, a first material layer 220 and a second material layer 240 are sequentially formed on a third material layer 204. The third material layer 204 is an underlying structure to be patterned with the hard mask obtained according to the embodiments of the present invention, which can be, for example, a polysilicon layer that will be used to form gates. Under the third material layer 204 may be a substrate 202, which can be formed by silicon or any other suitable material. It will be appreciated that the structure underlying the first material layer 220 is not limited to the structure shown in FIG. 2A. For example, optionally, there may be an oxide layer (not shown) between the substrate 202 and the third material layer 204. For another example, optionally, there may be a pad layer (not shown) on the third material layer 204, which can be nitride, oxide or any other suited material, and is used to prevent the underlying material layer from being damaged in subsequent processes. Processes and materials to form the substrate and the third material layer are well known to those skilled in the art, and will not be described in detail herein, in order not to obscure the principles of the present invention.

The first material layer 220 and the second material layer 240 can be sequentially formed on the third material layer 204 by deposition. Optionally, each layer 220, 240, 204 can be polished (for example, by chemical mechanical polishing (CMP)) after it is formed to obtain a planar surface. The first material layer 220 can be formed of silicon (e.g., monocrystalline silicon or polysilicon), metal, or any other suitable material. The metal can be, for example, tungsten, cobalt, nickel, etc. In subsequent steps, the first material layer 220 is processed to change the property in some regions thereof. The second material layer, also referred to as a cap layer, is used as a mask when the first material layer is processed. The second material layer can be formed of silicon nitride, silicon oxide or silicon nitride oxide, or can be other nitrides or any other suitable materials.

Figure 2B:
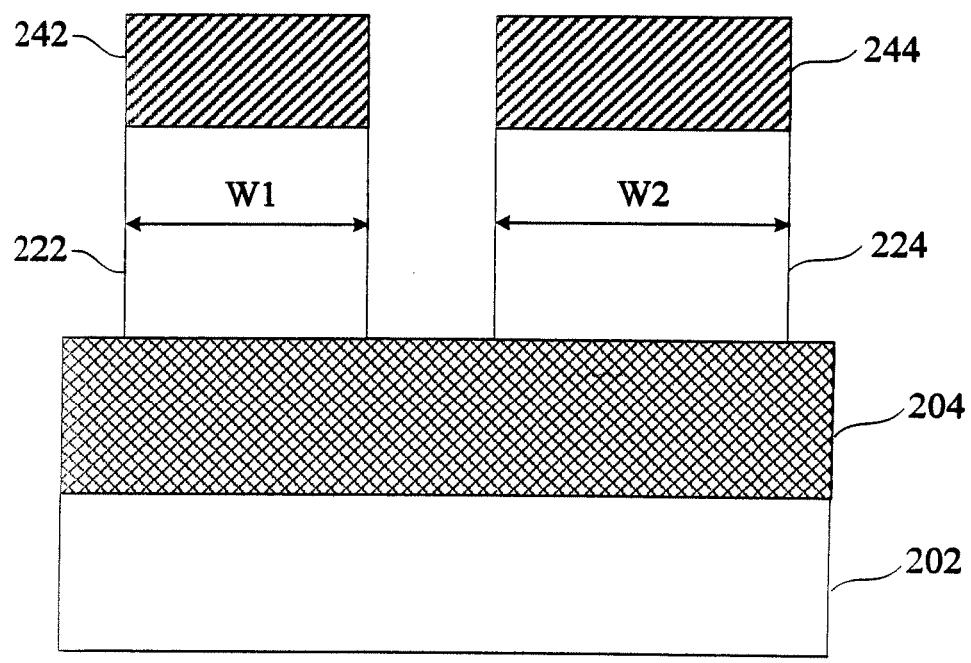

As shown in FIG. 2B, the first and second patterned material layers can be obtained by lithographing and etching the first material layer 220 and the second material layer 240. The first and second material layers are formed having identical patterns. The pattern features 222, 224 of the first material are shown in FIG. 2B, and the pattern features of the second material are shown as 242 and 244 in FIG. 2B. The lithographing and etching can be implemented through methods that are well known by those skilled in the art. Preferably, the structure shown in FIG. 2B can be obtained through anisotropic dry etching, such as reactive ion etching, plasma etching and the like. Depending upon the materials of the first and second material layers (hereinafter referred to as a first material and a second material, respectively), materials and parameters for the etching can be appropriately selected. Optionally, if necessary, an etch barrier layer can be used to improve the etch selectivity ratio.

Preferably, the patterns of the first and second patterned material layers are linear patterns or, alternatively, patterns composed of linear features. Pattern features of the first material can have the same or different sizes. In FIG. 2B, pattern features 222, 224 of the first material are illustrated as having different sizes of W1 and W2, respectively. Similarly, pattern features of the second material can have the same or different sizes. In FIG. 2B, pattern features 242, 244 of the second material are illustrated as having different sizes of W1 and W2, respectively. W1 and W2 can be any size that can be achieved with lithographing. The size of each pattern feature in the first and second patterned material layers can be determined in advance according to the desired hard mask pattern to be finally generated, which is described below.

Figure 2C:
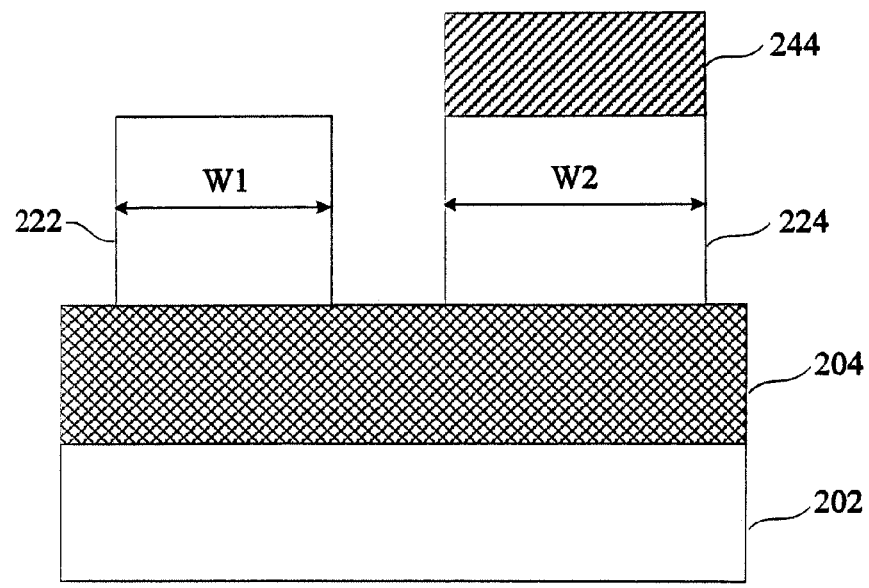

Next, part of the pattern features of the second material is selectively removed so that the resulting second patterned material layer covers only the top of predetermined regions of the first patterned material layer. As shown in FIG. 2C, a first pattern feature 242 of the second material covering a corresponding first pattern feature 222 of the first material is removed, while a second pattern feature 244 of the second material covering a corresponding second pattern feature 224 of the first material remains. The second material layer can be selectively removed through lithographing and etching. Such processes are well known by those skilled in the art, and will not be descried in detail further. The pattern features to be removed and the pattern features to remain of the second patterned material layer can be determined in advance as required.

In FIG. 2C, the second pattern feature 224 of the first material will be used in subsequent steps to form hard mask features having a minimum linewidth $CD_{min}$, and the first pattern feature 222 of the first material will be used in subsequent steps to form hard mask features having a linewidth that is equal to its width W1. Therefore, the width W2 of the second pattern feature 224 of the first material is determined based on the desired distance between the two hard mask features of the minimum linewidth $CD_{min}$ to be formed from this second pattern feature 224, and the width W1 of the first pattern feature 222 of the first material is determined based on the desired linewidth of the hard mask feature to be formed from this first pattern feature 222.

Figure 4A:
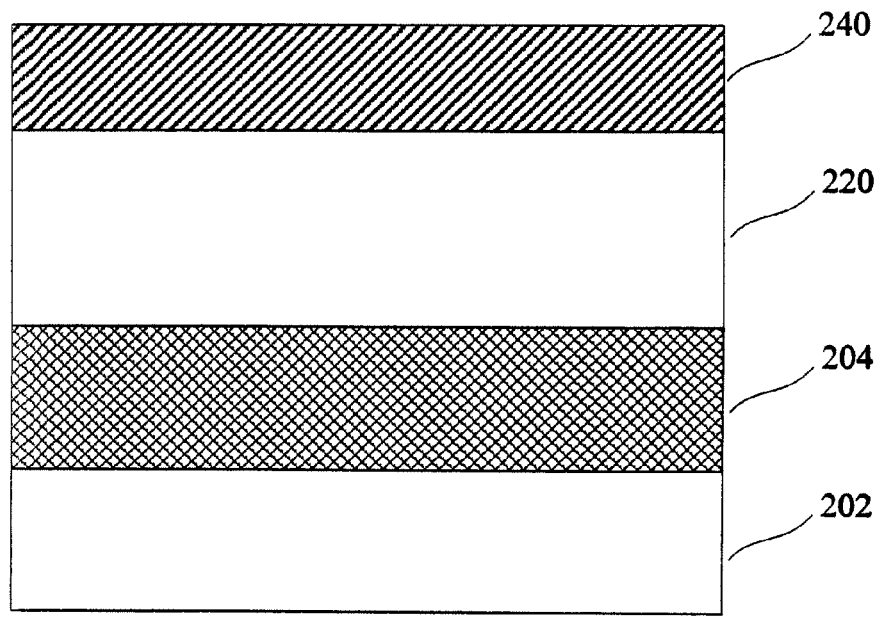
FIGS. 4A-4C shows an alternative exemplary method for forming the structure in FIG. 2C.
Figure 4B:
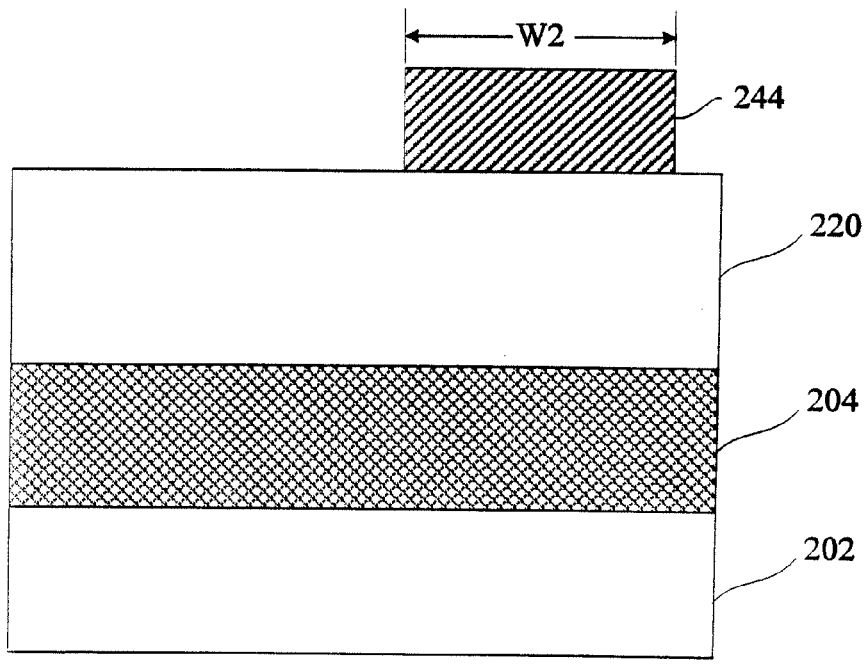
Figure 4C:
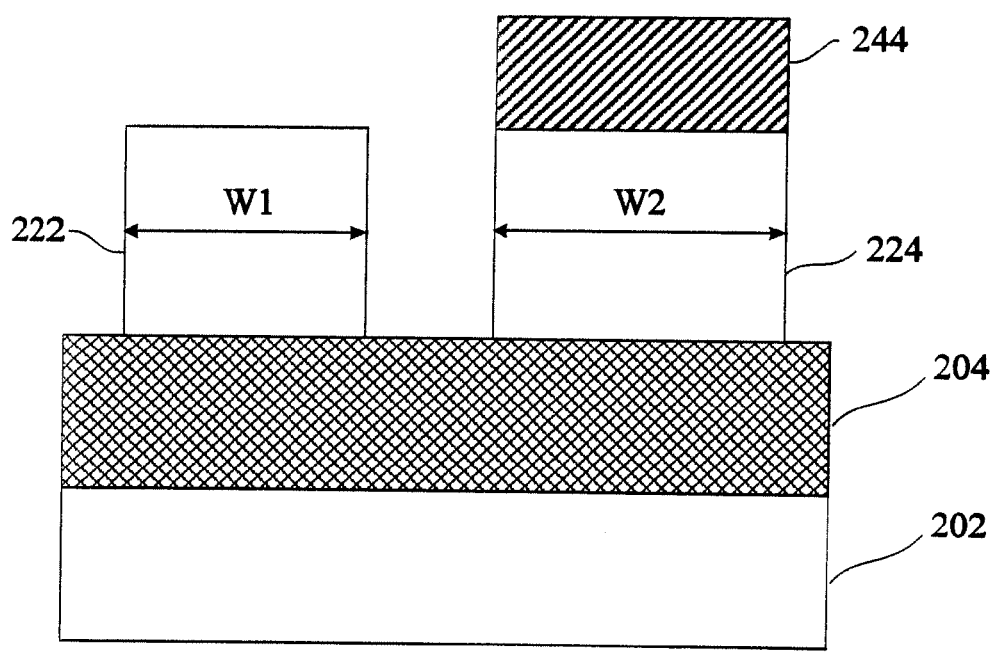

Alternatively, the structure shown in FIG. 2C can be obtained through steps shown in FIGS. 4A-4C. Similar to FIG. 2A, in FIG. 4A, a first material layer 220 and a second material layer 240 are sequentially formed on a third material layer 204. Next, the second material layer 240 is patterned through, for example, lithographing and etching, causing the resulting second patterned material layer to only cover the top of predetermined regions of the first material layer 220, as shown in FIG. 4B. Then, the structure shown in FIG. 4B is lithographed and etched to pattern the first material layer 220. Thus, first and second patterned material layers are obtained, wherein the second patterned material layer merely covers the top of predetermined regions (224 in FIG. 4C) of the first patterned material layer, as shown in FIG. 4C. The structure shown in FIG. 4C is identical to the structure shown in FIG. 2C.

Those skilled in the art will appreciate that the first and second patterned material layers shown in FIG. 2C or FIG. 4C can be obtained with any appropriate method such that the second patterned material layer only covers the top of predetermined regions of the first patterned material layer, which is not limited to the method described in the above embodiment. For example, the structure shown in FIG. 2C can also be obtained through first depositing and patterning the first material layer 220 on the third material layer 204, and then depositing and patterning the second material layer 240 on the first patterned material layer 220.

Figure 2D:
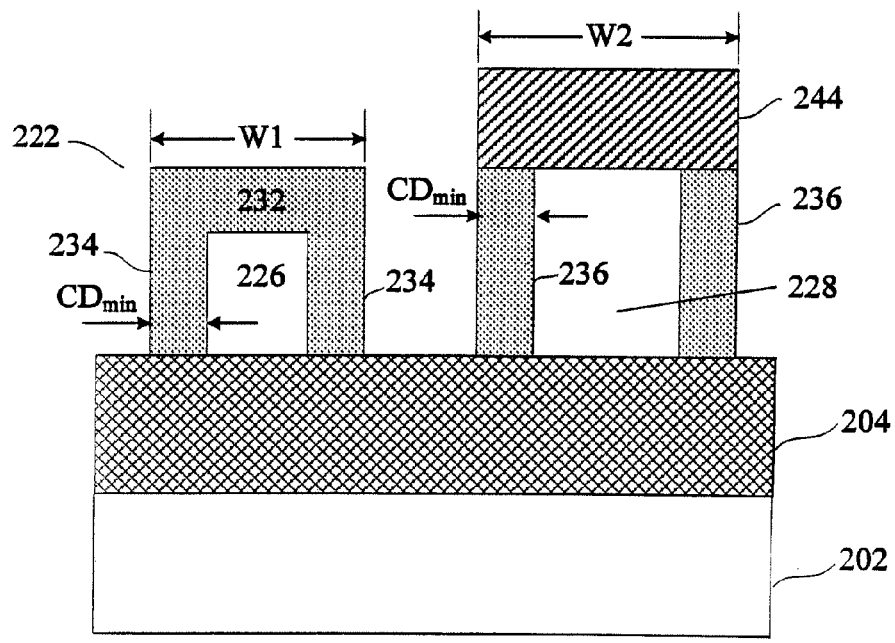

Upon obtaining the structures of FIG. 2C and FIG. 4C, the method according to an embodiment of the present invention proceeds as follows—taking the second patterned material layer as a mask, a property of the exposed top and side portions of the first patterned material layer is changed, so as to form property-changed roofs at the exposed top portions of the first patterned material layer, and property-changed sidewalls with a predetermined width at the exposed side portions of the first patterned material layer. Those skilled in the art will appreciate that the roofs are formed thick enough to prevent the underlying third material layer 204 from being etched in subsequent processes. As shown in FIG. 2D, for example, taking the second patterned material layer 244 as a mask, the exposed top and side portions of the first patterned material layer 222, 224 are treated to have a property changed. As to the first pattern feature 222 of the first material, its top and side portions are all exposed, and therefore a property-changed roof 232 and property-changed sidewalls 234 are constructed. As to the second pattern feature 224 of the first material, its top is covered by the second pattern feature 244 of the second material and only the side portions are exposed, thus forming property-changed sidewalls 236 with a portion 228 remaining unchanged. Property-changed sidewalls 234, 236 have a width equal to the predetermined minimum linewidth $CD_{min}$. In the double patterning technique, $CD_{min}$ is generally smaller than the minimum size that can be achieved through a single lithographing procedure, such that the pattern density can be improved. It can be seen from FIG. 2D that, if W1>2*$CD_{min}$, there is a portion of material having an unchanged property between the two sidewalls 234 and under the roof 232, as indicated by 226 in FIG. 2D. On the other hand, if W1≤2*$CD_{min}$, the two sidewalls 234 will adjoin each other and, like the doped portion 130 in FIG. 1, the whole first pattern feature 222 of the first material has its property changed.

In this step, a property of the exposed top and side portions of the first patterned material layer can be changed in a variety of ways. For example, the exposed portions of the first patterned material layer can be doped. The doping can be implemented through implantation (e.g., ion implantation). The doped material can be, for example, arsenic, phosphorus, boron, indium and the like. Alternatively, if the first material is silicon, the exposed portions of the first patterned material layer can be treated through a self-aligned salicide (salicide) process to change their property. The salicide process, well known by those skilled in the art, generally comprises the following steps: depositing a metal layer, annealing, and removing un-reacted portions of the metal layer. The metal to be deposited can be nickel, cobalt, titanium or any other suitable metal. With the salicide process, a metal silicide can be produced through the reaction of metal and silicon, which is then used as the material of the hard mask. As another alternative, the shown structure can be treated in a reacting gas atmosphere to change a property of the exposed portions of the first patterned material layer. The reacting gas can contain oxygen or ammonia, and the treatment can be a thermal or plasma treatment. It will be appreciated that the methods that can change the property for the exposed top and side portions of the first patterned material layer can be implemented individually or in any combination.

Figure 2E:
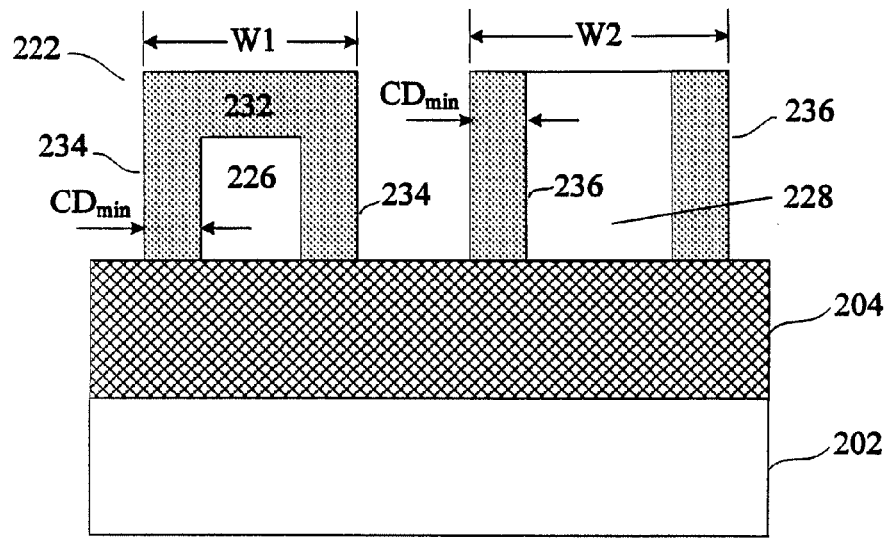
Figure 2F:
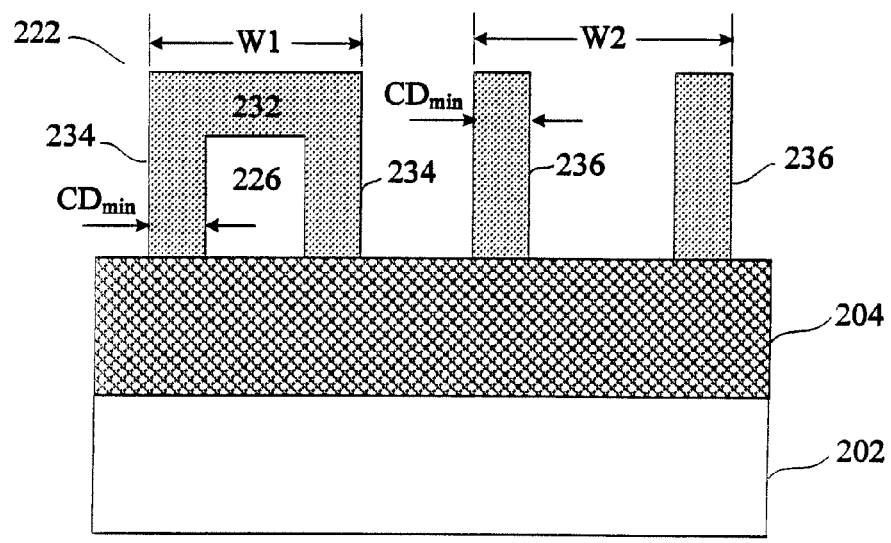

Upon obtaining the structure shown in FIG. 2D, the second patterned material layer 244 is removed to produce the structure shown in FIG. 2E. The second patterned material layer can be removed through various techniques that are well known by those skilled in the art, such as common dry etching or wet etching. The exposed portion 228 of the first material with unchanged property is removed through a selective material removing process, so as to produce the structure shown in FIG. 2F, wherein the portions 222 and 236 are retained on the third material layer 204 to form the final hard mask. In this step, an appropriate process can be selected to remove the portion 228 with unchanged property based on the properties of the first material and the material of the hard mask. For example, if the first material is silicon and the hard mask is a metal silicide, an aqueous solution containing $NH_3$ can be utilized in etching. As a still further example, if the first material is nickel, and the hard mask is nickel silicide, then a Sulfuric Peroxide Mixture (SPM) can be utilized to remove the portion 228 with unchanged property.

Figure 3A:
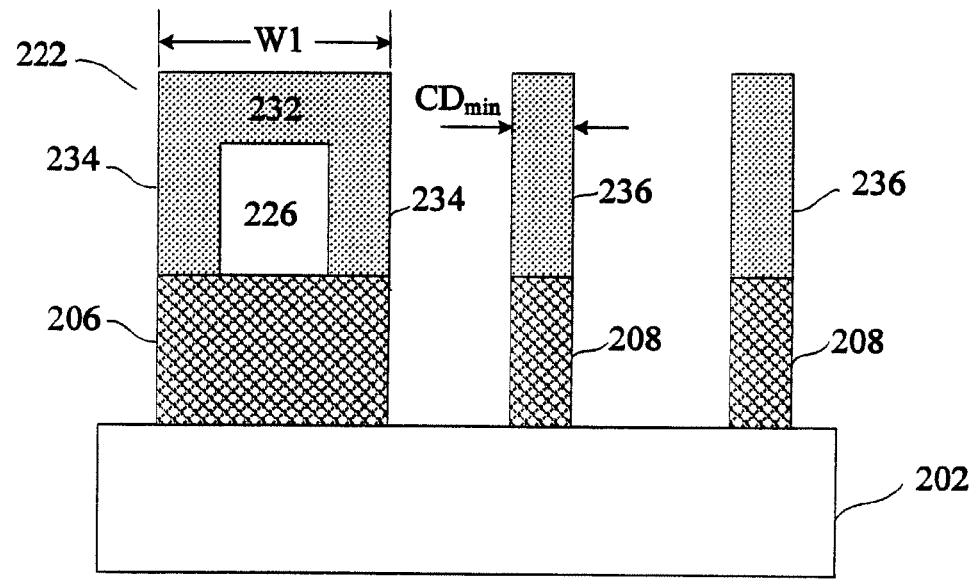
FIGS. 3A-3B are sectional views of structures in the respective steps of a method for patterning a material layer with the hard mask obtained in FIG. 2 according to an embodiment of the present invention.
Figure 3B:
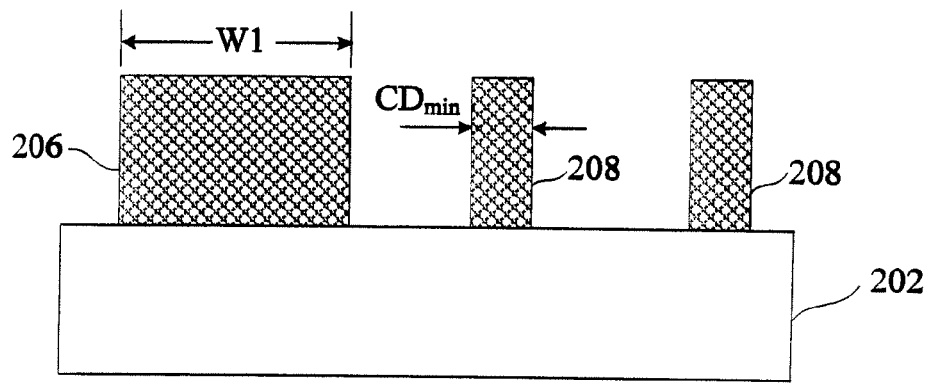

FIGS. 3A-3B show, according to an embodiment of the present invention, sectional views of structures in the respective steps of a method for patterning the third material layer 204 with the hard mask obtained in FIG. 2.

As shown in FIG. 3A, the third material layer 204 was patterned with the hard mask produced in FIG. 2. Then, the hard mask layer is removed to obtain the pattern shown in FIG. 3B. The linewidth of the pattern feature 206 is W1 and the linewidth of the pattern feature 208 is $CD_{min}$.

It can be seen from the above discussion that, the linewidth W1 of the pattern feature 206 can be realized as any desired size that is larger than $CD_{min}$. Thus, pattern linewidths that can be obtained by the present invention are not limited by $CD_{min}$, and more varied pattern widths can be achieved. Further, the method of the embodiment of the present invention can achieve a better control of pattern density.

Exemplary embodiments of the present invention have been described above, and the present invention is not limited to these embodiments. Some steps that are well known by those skilled in the art may be not discussed in the above embodiments, but are not intended to be excluded from the present invention. For example, to facilitate the control of etching, etching barrier layers can be formed as required between the layers shown in the drawings. Also, for example, after each step, chemical mechanical polishing can be carried out as required to facilitate subsequent processes.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the claims.

What is claimed is:

1. A method for forming a hard mask in semiconductor device fabrication, comprising:
    forming first and second patterned material layers on a third material layer, the second patterned material layer only covering the top of predetermined regions of the first patterned material layer;
    changing a property of the exposed top and side portions of the first patterned material layer using the second patterned material layer as a mask, so as to form property-changed roofs at the exposed top portions of the first patterned material layer and form property-changed sidewalls with a predetermined width at the exposed side portions of the first patterned material layer;
    removing the second patterned material layer; and
    removing portions of the first patterned material layer which have exposed tops and an unchanged property and are located between the property-changed sidewalls, so as to form the hard mask,
    wherein patterns in the first and second patterned material layers are linear patterns, and at least some patterns in the predetermined regions of the first patterned material layer have linewidths larger than twice the predetermined width.

2. The method according to claim 1, wherein the step of forming the first and second patterned material layers uses a double patterning procedure comprising:
    depositing a first material layer on the third material layer;
    depositing a second material layer on the first material layer;
    lithographing and etching the second material layer to produce the second patterned material layer, such that the second patterned material layer only covers the top of the predetermined regions of the first material layer; and
    lithographing and etching the first material layer to produce the first patterned material layer,
    wherein the predetermined width is less than a minimum width of lines that can be obtained in a single lithographing step.

3. The method according to claim 1, wherein the step of forming the first and second patterned material layers comprises:
    depositing a first material layer on the third material layer;
    depositing a second material layer on the first material layer;
    producing identical patterns through lithographing and etching on the first and second material layers; and
    removing the second patterned material layer from regions other than the predetermined regions of the first patterned material layer,
    wherein the predetermined width of the side walls is less than the minimum width of lines that can be obtained in a single lithographing step.

4. The method according to claim 1, wherein the material of the first patterned material layer is silicon or metal.

5. The method according to claim 1, wherein the material of the second patterned material layer is silicon nitride, silicon oxide or silicon nitride oxide.

6. The method according to claim 1, wherein changing the property of the exposed top and side portions of the first patterned material layer comprises:
    doping the exposed top and side portions of the first patterned material layer.

7. The method according to claim 6, wherein the doping is carried out by implantation.

8. The method according to claim 1, wherein the material of the first patterned material layer is silicon, and wherein changing the property of the exposed top and side portions of the first patterned material layer comprises:
    applying a salicide process thereto.

9. The method according to claim 8, wherein the salicide process comprises: depositing a metal layer, annealing and then removing portions of the metal layer un-reacted by the silicide process.

10. The method according to claim 9, wherein the metal is nickel, cobalt or titanium.

11. The method according to claim 1, wherein changing the property of the exposed top and side portions of the first patterned material layer comprises:
treatment in a reacting gas atmosphere.

12. The method according to claim 11, wherein the reacting gas is an oxygen-contained gas or a $NH_3$-contained gas.

13. The method according to claim 11, wherein the treatment is a thermal treatment.

14. The method according to claim 11, wherein the treatment is a plasma treatment.

15. A method for fabricating a semiconductor device, comprising:
forming first and second patterned material layers on a third material layer, the second patterned material layer only covering the top of predetermined regions of the first patterned material layer;
changing a property of exposed top and side portions of the first patterned material layer using the second patterned material layer as a mask, so as to form property-changed roofs at the exposed top portions of the first patterned material layer and form property-changed sidewalls with a predetermined width at the exposed side portions of the first patterned material layer;
removing the second patterned material layer;
removing portions of the first patterned material layer which have exposed tops and an unchanged property and are located between the property-changed sidewalls, so as to form a hard mask;
patterning the third material layer using the hard mask; and
removing the hard mask,
wherein patterns in the first and second patterned material layers are linear patterns, and at least some patterns in the predetermined regions of the first patterned material layer have linewidths larger than twice the predetermined width.

16. The method according to claim 15, wherein the material in the third material layer is polysilicon, the material in the first patterned material layer is silicon or metal, and the material in the second patterned material layer is silicon nitride, silicon oxide or silicon nitride oxide.

17. The method according to claim 15, wherein the step of forming the first and second patterned material layers comprises:
depositing a first material layer on the third material layer;
depositing a second material layer on the first material layer;
producing identical patterns through lithographing and etching on the first and second material layers; and
removing the second patterned material layer from regions other than the predetermined regions of the first patterned material layer,
wherein the predetermined width of the side walls is less than the minimum width of lines that can be obtained in a single lithographing step.

18. The method according to claim 15, wherein the property of the exposed top and side portions of the first patterned material layer is changed by at least one of:
doping the exposed top and side portions of the first patterned material layer;
a salicide process; or
a treatment in a reacting gas atmosphere.

* * * * *